United States Patent [19]
Sakamoto et al.

[11] Patent Number: 5,889,297
[45] Date of Patent: Mar. 30, 1999

[54] HIGH FREQUENCY SEMICONDUCTOR DEVICE WITH SLOTS

[75] Inventors: Koichi Sakamoto, Otsu; Yohei Ishikawa, Kyoto, both of Japan

[73] Assignee: Murata Manufacturing Co., Ltd., Japan

[21] Appl. No.: 884,357

[22] Filed: Jun. 27, 1997

[30] Foreign Application Priority Data

Jun. 28, 1996 [JP] Japan .................................... 8-188148

[51] Int. Cl.$^6$ .......................... H01L 29/80; H01L 31/112
[52] U.S. Cl. .......................... 257/192; 257/194; 257/195; 257/259; 257/280
[58] Field of Search ..................................... 257/194, 192, 257/259, 280, 401, 202, 208, 203, 206, 28, 281, 282, 368, 195

[56] References Cited

U.S. PATENT DOCUMENTS

| | | | |
|---|---|---|---|
| 3,737,743 | 6/1973 | Goronkin et al. | 257/280 |
| 4,315,272 | 2/1982 | Vorhaus | 257/280 X |
| 5,168,329 | 12/1992 | Shiga | 257/280 X |

FOREIGN PATENT DOCUMENTS

| | | | |
|---|---|---|---|
| 3-232248 | 10/1991 | Japan | 257/280 |
| 3-270024 | 12/1991 | Japan | 257/280 |

*Primary Examiner*—William Mintel
*Attorney, Agent, or Firm*—Ostrolenk, Faber, Gerb & Soffen, LLP

[57] ABSTRACT

On two active areas formed in a semiconductor substrate, source electrodes, gate electrodes, and drain electrodes are disposed symmetrically to each other. A gate pad section electrically connected to both gate electrodes is disposed at one side of the active areas, and a drain pad section electrically connected to both drain electrodes is disposed at the other side of the active areas. A source pad section electrically connected to one source electrode is disposed at one side of the gate pad section and the drain pad section, and a source pad section electrically connected to the other source electrode is disposed at the other side of the gate pad section and the drain pad section. An input slot line is formed between the gate pad section and the source pad sections, and an output slot line is formed between the drain pad section and the source pad sections.

8 Claims, 11 Drawing Sheets

HIGH FREQUENCY SEMICONDUCTOR DEVICE WITH SLOTS

BACKGROUND OF THE INVENTION

1. Field of the Invention

The present invention relates to high-frequency semiconductor devices. The present invention more particularly relates to a high-frequency semiconductor device for use in a millimeter-wave or quasi-millimeter-wave circuit module for amplification, oscillation, or modulation.

2. Description of the Related Art

FIG. 1 is a plan view showing a structure of a high-frequency semiconductor device (HEMT) 1 that is currently in common use. In this semiconductor device 1, on the upper surface of a compound semiconductor substrate 2 (width: 300 μm, length: 400 μm) in which two active areas 3a and 3b are formed, a drain pad section 4 is disposed at one side against the line connecting the active areas 3a and 3b, which serves as a boundary, two gate pad sections 8 are disposed at the other side, and a source pad section 6 is disposed around the gate pad sections 8. Drain electrodes 5 extend from the drain pad section 4 toward the active areas 3a and 3b, respectively. Source electrodes 7, each divided into two portions, extend from the source pad section 6 to the active areas 3a and 3b, respectively. Gate electrodes 9 extend from the gate pad sections 8 toward the active areas 3a and 3b such that the gate electrodes pass between the two divided portions of the source electrodes 7. Each gate electrode 9 (which is very narrow and has a gate length Lg of 0.15 μm) is disposed between the drain electrode 5 and the source electrode 7 in each of the active areas 3a and 3b.

When this semiconductor device 1 is mounted to an external circuit board, the source electrodes 7 are connected to the ground of the circuit board with bonding wire connected to the source pad section 6, and the gate electrodes 9 and the drain electrodes 5 are connected to RF signal lines of the circuit board with bonding wire connected to the gate pad sections 8 and the drain pad section 4, respectively. An RF signal is input to the gate electrodes 9 from the circuit board through the bonding wire and output from the drain electrodes 5 to the circuit board through the bonding wire.

When an RF signal is transmitted through a bonding wire, it is known that the RF characteristics of the semiconductor device 1 deteriorate due to the parasitic inductance of the bonding wire at high frequencies (especially at the frequency of a millimeter wave). As understood from the structure of the semiconductor device 1 shown in FIG. 1, since the source electrodes 7 are disposed very close to the gate electrodes 9, parasitic capacitance exists between the gate electrodes 9 and the source electrodes 7. Due to parasitic capacitance between the gate electrodes 9 and the rear surface of the semiconductor substrate 2 in addition to the above parasitic capacitance, the high-frequency characteristics of the semiconductor device 1 deteriorate.

To reduce parasitic components generated in a semiconductor device, flip-chip mounting using solder bumps may be employed instead of bonding wire. When flip-chip mounting is used, although parasitic inductance caused by bonding wire decreases, there is an increase in parasitic capacitance between an electrode pad and a circuit board. This method therefore does not essentially solve the problem.

Since the drain pad section 4 is spaced away from the source pad section 6 at the drain electrodes 5, parasitic capacitance between those pad sections 4 and 6 is small. Since the surface of the semiconductor is not covered by an electrode between the drain pad section 4 and the source pad section 6, however, a surface wave may be generated between those two electrodes, which causes a loss and deterioration of the RF characteristics.

As described above, a high-frequency semiconductor device having the conventional structure has a problem of characteristics deterioration caused by parasitic components, such as parasitic capacitance and inductance, and thereby yield in manufacturing semiconductor devices is reduced. It is very difficult to suppress the characteristics deterioration in a high-frequency semiconductor device having the conventional structure.

SUMMARY OF THE INVENTION

The present invention is made in consideration of the above-described drawbacks in a conventional device. An accomplishment of the present invention is to reduce parasitic components in a high-frequency semiconductor device in order to prevent its characteristics from deteriorating.

According to one aspect of the present invention, in a high-frequency semiconductor device, a source electrode and a drain electrode are disposed with a gate electrode placed therebetween on an active area formed in a semiconductor substrate; a gate pad section electrically connected to the gate electrode is formed at one side of the active area on the semiconductor substrate and a drain pad section electrically connected to the drain electrode is formed at the other side; a source pad section electrically connected to the source electrode is disposed in a position opposed to the gate pad section and the drain pad section; and slot lines are formed between the gate pad section and the source pad section and between the drain pad section and the source pad section.

The semiconductor device described above may have one active area or a plurality of active areas.

According to another aspect of the present invention, in a high-frequency semiconductor device, a source electrode and a drain electrode are disposed with a gate electrode placed therebetween on each of a plurality of active areas formed in a semiconductor substrate, wherein the source electrodes, the gate electrodes, and the drain electrodes are disposed symmetrically to each other in adjacent active areas; a gate pad section electrically connected to both gate electrodes provided for the adjacent active areas is disposed at an area on one side on the semiconductor substrate, and a drain pad section electrically connected to both drain electrodes provided for the adjacent active areas is disposed at an area on the other side on the semiconductor substrate; source pad sections electrically connected to the source electrodes provided for the adjacent active areas are disposed on both sides of the gate pad section and the drain pad section; and slot lines are formed between the gate pad section and the source pad sections and between the drain pad section and the source pad sections.

The semiconductor device described above has a plurality of active areas and electrodes are symmetrically disposed and connected in parallel in adjacent active areas. Therefore, since high-frequency signals output from adjacent active areas are combined in reverse phases, even-order harmonics are suppressed. This harmonics suppression effect is especially great in power devices in which substantial harmonics are generated.

In the high-frequency semiconductor devices described above, since a high-frequency signal transfers through a slot line formed between the source pad section and the gate pad section or the drain pad section, no parasitic inductance or parasitic capacitance is generated between these pad sections or between electrodes, unlike in a conventional semiconductor device, and the semiconductor device achieves the maximum high-frequency characteristics which it inherently has.

In addition, in a semiconductor device according to the present invention, most of the substrate area other than the area of the slot lines is covered by the source pad sections, the gate pad section, and the drain pad section, so the generation of a surface wave can be suppressed, which is a problem in a millimeter-wave device.

The high-frequency semiconductor device described above may be configured such that a gate bias is applied to the center line of the gate pad section and a drain bias is applied to the center line of the drain pad section.

In the high-frequency semiconductor device configured as described above, mutual interference between slot lines formed at both sides of the gate pad section and the drain pad section can be eliminated and signals having phases reverse to each other can be generated.

It is important to take input and output impedance matching into consideration when determining the width of a slot line in a semiconductor device. Therefore, in a high-frequency semiconductor, as described above, having the gate electrode with a gate length of 0.12 to 0.18 $\mu$m and a gate width of 40 to 80 $\mu$m, the widths of the slot lines should range from 0.06 to 0.12 mm. Since the impedance of a circuit board is frequently set to 50 to 100 $\Omega$, a millimeter-wave semiconductor device having a gate length of 0.12 to 0.18 $\mu$m and a gate width of 40 to 80 $\mu$m usually has an input impedance of 50 to 70 $\Omega$ and an output impedance of 70 to 90 $\Omega$ at 60 GHz. In this case, when the width of a slot line is set to 0.06 to 0.12 mm, input and output matching can be obtained for the entire semiconductor device and the reflection loss of a high-frequency signal can be minimized.

According to still another aspect of the present invention, in a high-frequency semiconductor device, a source electrode and a drain electrode are disposed with a gate electrode placed therebetween on an active area formed in a semiconductor substrate; a gate pad section electrically connected to the gate electrode is formed at one side of the active area on the semiconductor substrate and a source pad section electrically connected to the source electrode is formed at the other side; a drain pad section electrically connected to the drain electrode is disposed in a position opposed to the gate pad section and the source pad section; and slot lines are formed between the gate pad section and the drain pad section and between the drain pad section and the source pad section.

According to yet another aspect of the present invention, in a high-frequency semiconductor device, a source electrode and a drain electrode are disposed with a gate electrode placed therebetween on each of a plurality of active areas formed in a semiconductor substrate, wherein the source electrodes, the gate electrodes, and the drain electrodes are disposed symmetrically to each other in adjacent active areas; a gate pad section electrically connected to both gate electrodes provided for the adjacent active areas is disposed in an area on one side on the semiconductor substrate, and a source pad section electrically connected to both source electrodes provided for the adjacent active areas is disposed in an area on the other side on the semiconductor substrate; drain pad sections electrically connected to the drain electrodes provided for the adjacent active areas are disposed on both sides of the gate pad section and the source pad section;

and slot lines are formed between the gate pad section and the drain pad sections and between the drain pad sections and the source pad section.

The high-frequency semiconductor device described above may be configured such that a gate bias is applied to the center line of the gate pad section and a source bias is applied to the center line of the source pad section.

In some of the high-frequency semiconductor devices described above, the source electrode and the source pad section can be interchanged with the drain electrode and the drain pad section, as compared with the other high-frequency semiconductor devices.

DESCRIPTION OF EMBODIMENTS OF THE INVENTION (First embodiment)

Figure 2:
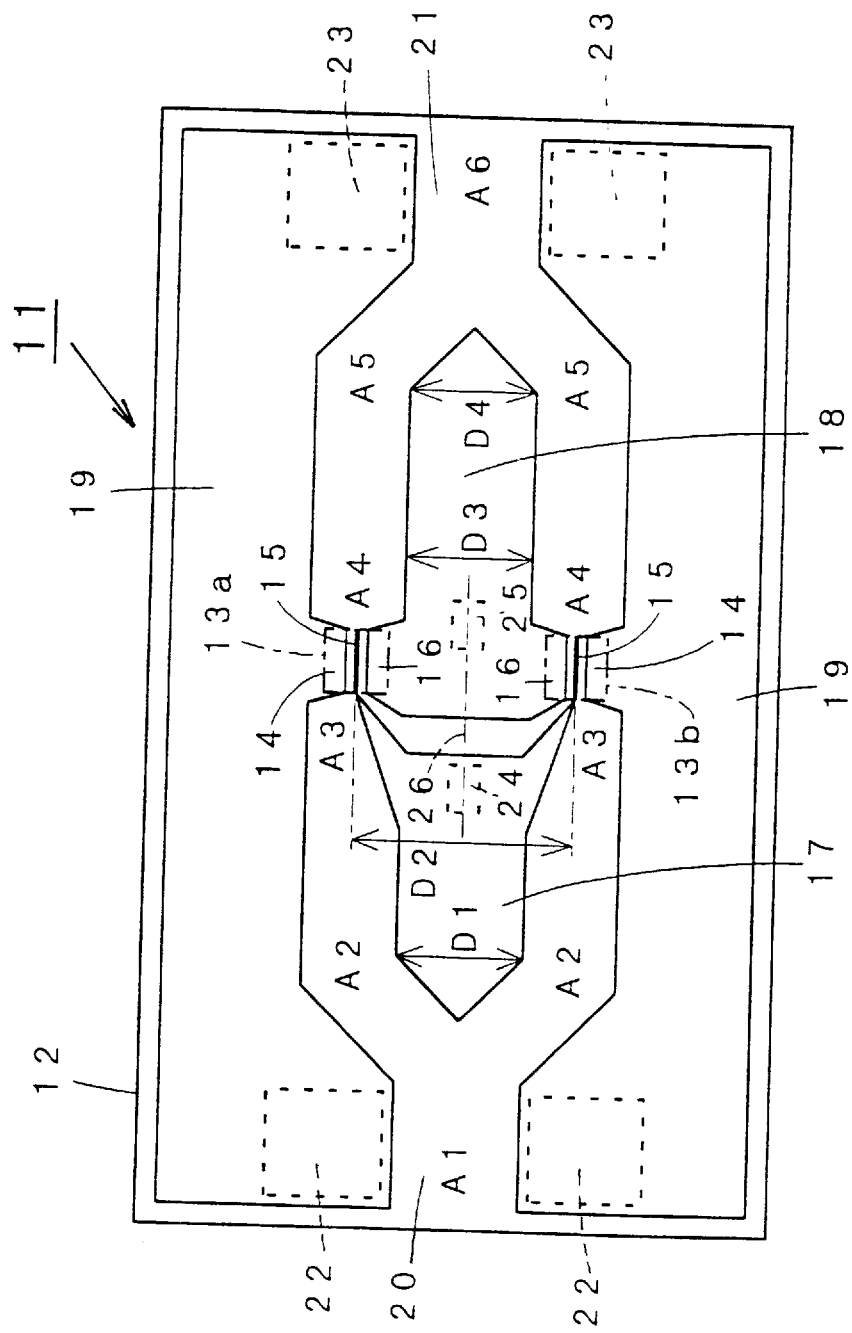
FIG. 2 is a plan view showing a high-frequency semiconductor device according to a first embodiment of the present invention.

FIG. 2 is a plan view showing a structure of a high-frequency semiconductor device 11 according to one embodiment of the present invention. The device is usable for amplification and/or oscillation. Two active areas 13a and 13b are formed in the front-surface layer of a semiconductor substrate 12, such as a semi-insulating GaAs substrate. The semiconductor device 11 may be a field effect transistor, such as an MESFET or an HEMT, or a modified type thereof.

The two active areas 13a and 13b are disposed in parallel to the shorter sides of a device area in the semiconductor substrate 12. In both active areas 13a and 13b, source electrodes 14, gate electrodes 15, and drain electrodes 16 are formed from the outside in that order. In other words, the electrodes 14 to 16 provided for both active areas 13a and 13b are symmetrically disposed, respectively. The gate electrodes 15 in both active areas 13a and 13b extend from a gate pad section 17 provided closer to the signal input side than the active areas 13a and 13b. The drain electrodes 16 in both active areas 13a and 13b extend from a drain pad section 18 provided closer to the signal output side than the active areas 13a and 13b. At both sides on the upper surface of the semiconductor substrate 12, source pad sections 19 are formed such that they sandwich the gate pad section 17 and the drain pad section 18, and the source electrodes 14 extend from the source pad sections 19.

The input side of the semiconductor device 11 is formed by both source pad sections 19 and the gate pad section 17, and a Y-shaped, branched input slot line 20 is formed between the gate pad section 17 and the source pad sections 19. In the same way, the output side is formed by both source pad sections 19 and the drain pad section 18, and a Y-shaped, branched output slot line 21 is formed between the drain pad section 18 and the source pad sections 19.

At positions which sandwich an end of the input slot line 20, via holes 22 electrically connected to the source pad sections 19 are formed in the semiconductor substrate 12. At positions which sandwich an end of the output slot line 21, via holes 23 electrically connected to the source pad sections 19 are formed in the semiconductor substrate 12. A via hole 24 electrically connected to the gate pad section 17 and a via hole 25 electrically connected to the drain pad section 18 are formed in the semiconductor substrate 12, and these via holes 24 and 25 are disposed at the center (on a short and long dotted line 26 shown in FIG. 2) of the gate pad section 17 and the drain pad section 18 such that the two slot lines 20 and 21 operate in reverse-phase mode. An RF signal and a DC bias are applied to the via holes 22 and 23 electrically connected to the source electrodes 14, and DC biases are applied to the via holes 24 and 25 electrically connected to the gate electrode 15 and the drain electrode 16.

The input and output slot lines 20 and 21 are designed such that their input and output impedances match those of the FET sections (intrinsic device sections) formed at the active areas 13a and 13b. In other words, the slot width and the slot length of the slot lines 20 and 21 are designed such that the impedances of the slot lines 20 and 21 match those of the FET sections.

Figure 3:
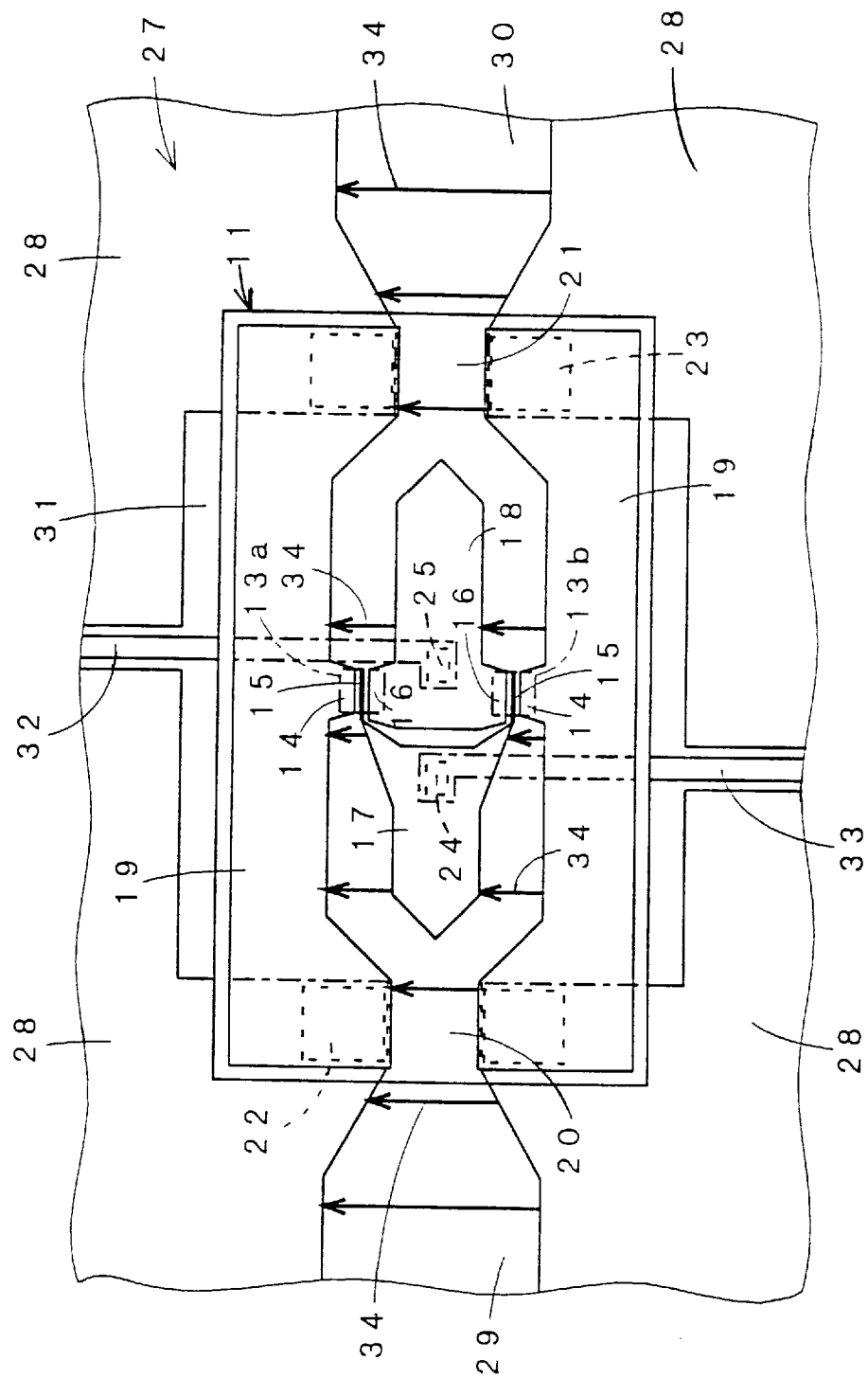
FIG. 3 is a partially-broken-away plan view showing a condition in which the above semiconductor device is mounted on a circuit board.

FIG. 3 illustrates a condition in which the above-described high-frequency semiconductor device 11 is mounted on a circuit board 27 so that the device is used as an amplifier. On the upper surface of the circuit board 27, an input slot line 29 and an output slot line 30 are formed between ground conductors 28, and the input slot line 29 and the output slot line 30 communicate with an exposed surface 31 which is an area where the ground conductors 28 are not present. A drain bias line 32 and a gate bias line 33 for applying DC biases with respect to the ground conductors 28 are placed such that they divide the ground conductors 28.

In the semiconductor device 11 mounted on the exposed surface 31 of the circuit board 27, the via holes 22 and 23 are connected to the ground conductors 28 at positions which sandwich the ends of the input and output slot lines 29 and 30 provided on the upper surface of the circuit board 27, and the slot lines 29 and 30 of the circuit board 27 are electrically connected to the slot lines 20 and 21 of the semiconductor device 11. The via hole 24 electrically connected to the center line of the gate pad section 17 is connected to the gate bias line 33 of the circuit board 27, and the via hole 25 electrically connected to the center line of the drain pad section 18 is connected to the drain bias line 32 of the circuit board 27.

Thick arrows 34 shown in FIG. 3 indicate transfer conditions of an RF signal (electromagnetic wave) transferring from the slot line 29 of the circuit board 27 through the semiconductor device 11 to the slot line 30 of the circuit board 27. An RF signal transfers through the input slot line 29 formed in the circuit board 27, and enters the slot line 20 of the semiconductor device 11 through the via holes 22. The RF signal which has entered the slot line 20 of the semiconductor device 11 is divided into two portions in the slot line 20 and reaches the active areas 13a and 13b. When the RF signal reaches the source electrodes 14 and the gate electrodes 15 in the active areas 13a and 13b, it receives signal processing, such as amplification, through a mutual effect with a carrier in the active areas 13a and 13b, and is output from the portions between the gate electrodes 15 and the drain electrodes 16 to the slot line 21. The RF signals output to the slot line 21 are combined at the junction of the slot line 21 and transferred to the slot line 30 of the circuit board 27 through the via holes 23. Therefore, an RF signal input to the input slot line 29 of the circuit board receives amplification and is output from the output slot line 30 of the circuit board 27.

Figure 1:
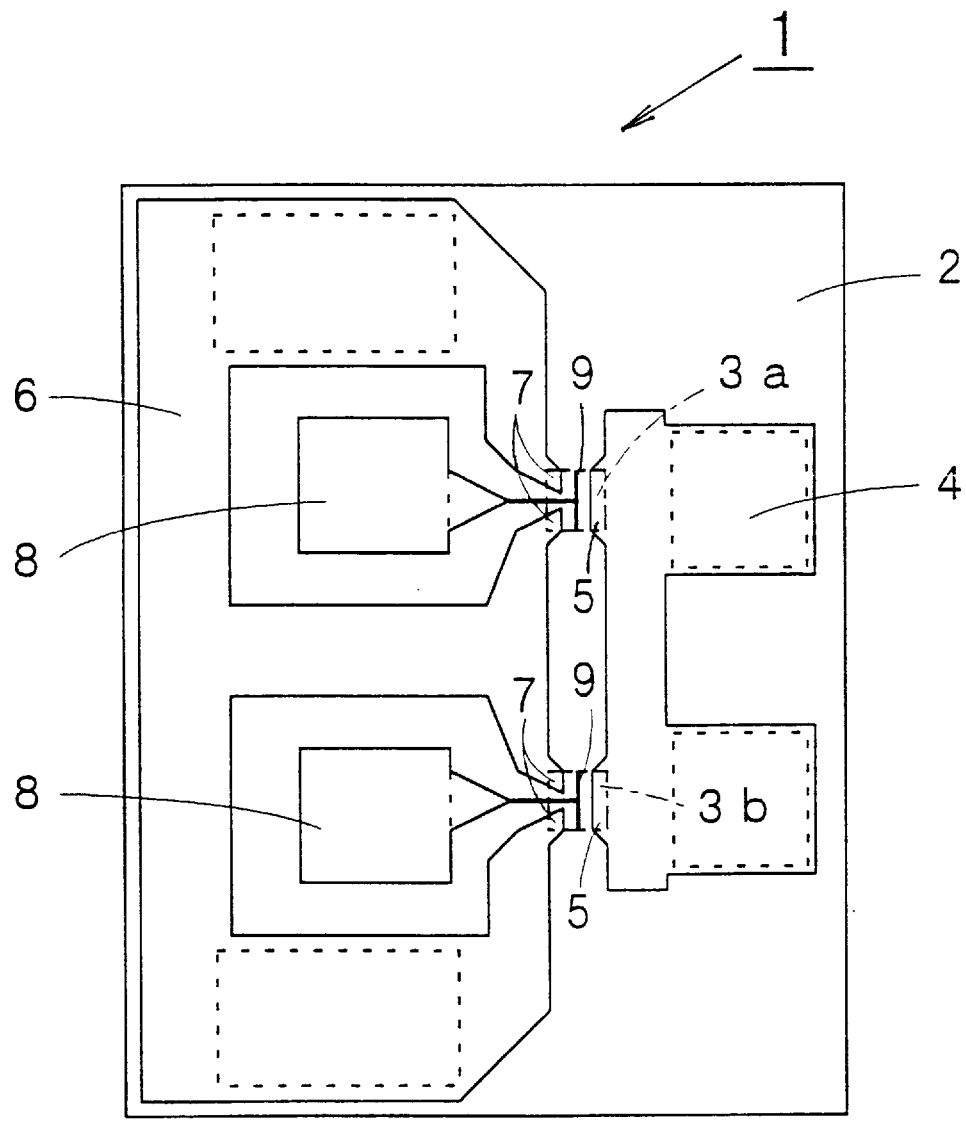
FIG. 1 is a plan view showing a structure of a conventional high-frequency semiconductor device.

Features of the semiconductor device 11 according to the present embodiment will be described by comparing the device with the conventional semiconductor device shown in FIG. 1. Since the conventional semiconductor device 1 is designed such that the gate pad sections 8 and the drain pad section 4 serve as electrodes in a lumped-constant circuit or electrodes having a microstripline structure, parasitic capacitance is generated between the gate pad sections 8 and the source pad section 6, and between the gate pad sections 8 and the drain pad section 4. In contrast, in the semiconductor device 11 according to the present embodiment of the invention, since an RF signal transfers through the slot line 20 disposed between the gate pad section 17 and the source pad sections 19 and through the slot line 21 disposed between the drain pad section 18 and the source pad sections 19, parasitic capacitance does not exist. Since the input and output impedances of the slot lines 20 and 21 match those of the gate electrodes 15, an RF signal passes through the device without reflection.

In the semiconductor device 11 according to the present embodiment, the gate pad section 17 and the drain pad section 18 are wide and the via holes 24 and 25 for DC biases are disposed respectively at the center lines of the pad sections 17 and 18. If the same structure were applied to the conventional semiconductor device 1, it is considered that parasitic capacitance would increase and the impedance would decrease so that input and output matching could not be obtained. In the semiconductor device 11 according to the present invention, however, the width of the gate pad section 17 and the via holes 22 are effective for preventing mutual interference between the two portions into which the slot line 20 branches, and the width of the drain pad section 18 and the via holes 23 are effective for preventing mutual interference between the two portions into which the slot line 21 branches. Since an RF signal passes through the slot lines 20 and 21, and does not transfer through the gate electrodes 15 and the drain electrodes 16, the electrodes themselves do not cause parasitic capacitance.

Figure 4A:
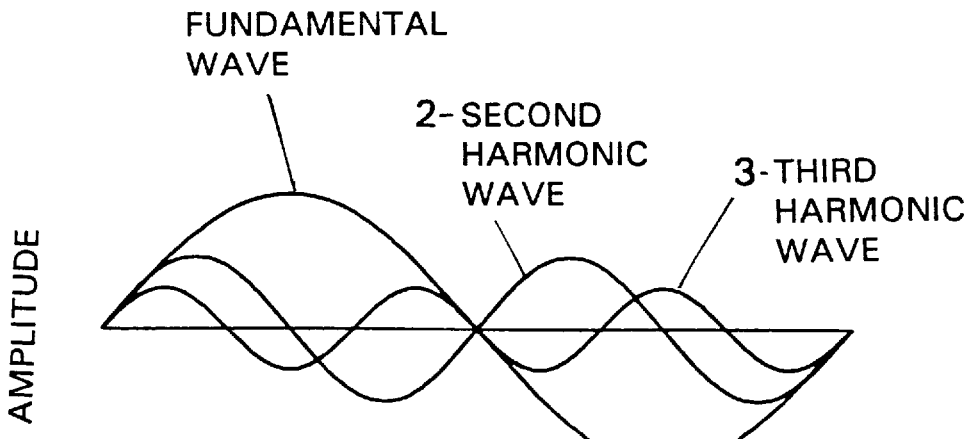
FIG. 4(a) is a chart indicating the waveform of an RF signal output from one active area.
Figure 4B:
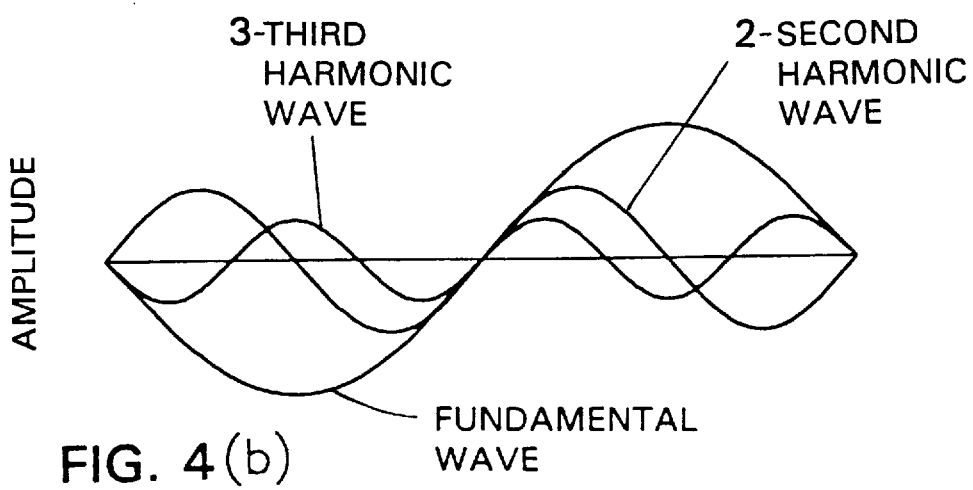
FIG. 4(b) is a chart indicating the waveform of an RF signal output from the other active area.
Figure 4C:
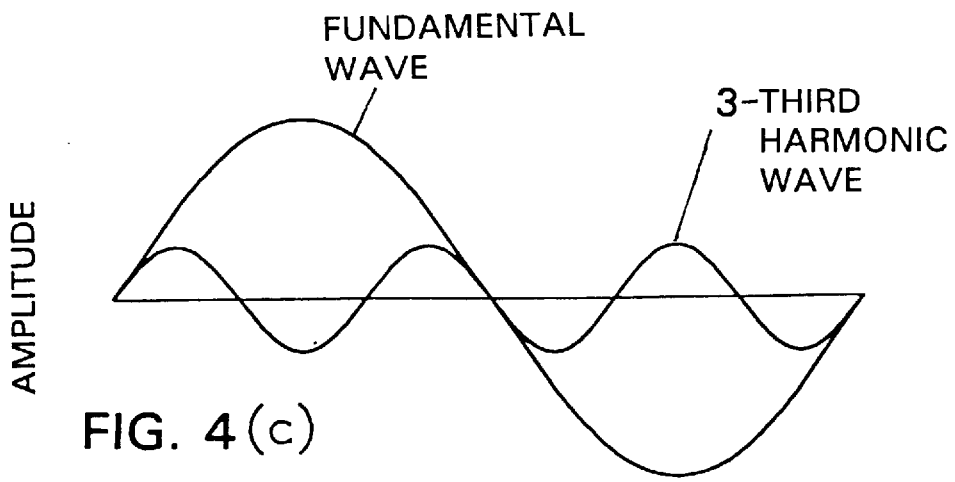
FIG. 4(c) is a chart indicating the waveform made by combining the waveform shown in FIG. 4(a) and the waveform shown in FIG. 4(b).

In the present embodiment, the divided RF signals are in reverse phase with the source electrode 14 being taken as the reference, and are amplified in the reverse phase and combined. Since RF signals passing through the two active areas 13a and 13b and transferring through the output slot line 21 are in reverse phase to each other, even-order harmonics are suppressed. More specifically, when the fundamental wave, the second harmonic wave, and the third harmonic wave shown in FIG. 4(a) are transferred from one active area, 13a, to the slot line 21, the fundamental wave, the second harmonic wave, and the third harmonic wave all having the reverse phase shown in FIG. 4(b) are transferred from the other active area, 13b, to the slot line 21. As a result of combining two waves having phases reverse to each other shown in FIGS. 4(a) and 4(b), only the fundamental wave and the third harmonic wave, which are odd-order waves, remain and the second harmonic wave (even-order waves in general) is suppressed and vanishes. In a power device, in which substantial amounts of harmonics are generated, this suppression effect for harmonics is significant. When a power device operates in the B class, for example, the power efficiency of the device increases by 10% to 20%. As a result, a harmonic suppression circuit formed outside the device can be simplified.

The dimensions of the semiconductor device 11 will be described below. The widths of the slot lines 20 and 21 formed in this high-frequency semiconductor device 11 are determined with input and output impedance matching being taken into consideration. The dimensions of the circuit board 27 or the device area are 400 μm in width and 600 μm in length. The impedance of the circuit board 27 is frequently set to 50 to 100 Ω. In a millimeter-wave semiconductor device having a gate length of 0.15 μm and a gate width of 50 μm, the input impedance Zi and the output impedance Zo of one gate electrode 15 are usually 50–70 Ω and 70–90 Ω at 60 GHz, respectively. In this case, when the widths of the slot lines 20 and 21 at portions indicated by A1 to A6 in FIG. 2 are set to 0.1 mm, 0.075 mm, 0.05 mm, 0.075 mm, 0.075 mm and 0.1 mm, respectively, input and output matching can be obtained for the entire semiconductor device 11, and the reflection loss of an RF signal is minimized.

The distances between the two portions of the slot lines at the positions indicated by A2 to A5 (namely, the widths D1 and D2 of the gate pad section 17 and the widths D3 and D4 of the drain pad section 18) in FIG. 2 must be 0.2 mm or more to prevent mutual interference of an RF signal between the two slot lines 20 and 21 and to connect the gate bias line 33 and the drain bias line 32 through the via holes 24 and 25. The thickness of the semiconductor substrate 12 is set to 0.05 to 0.13 mm (100 μm, for example) in order to reduce a connection loss of the slot lines 20 and 21 and to facilitate formation of via holes 22 to 25.

(Second embodiment)

Figure 5:
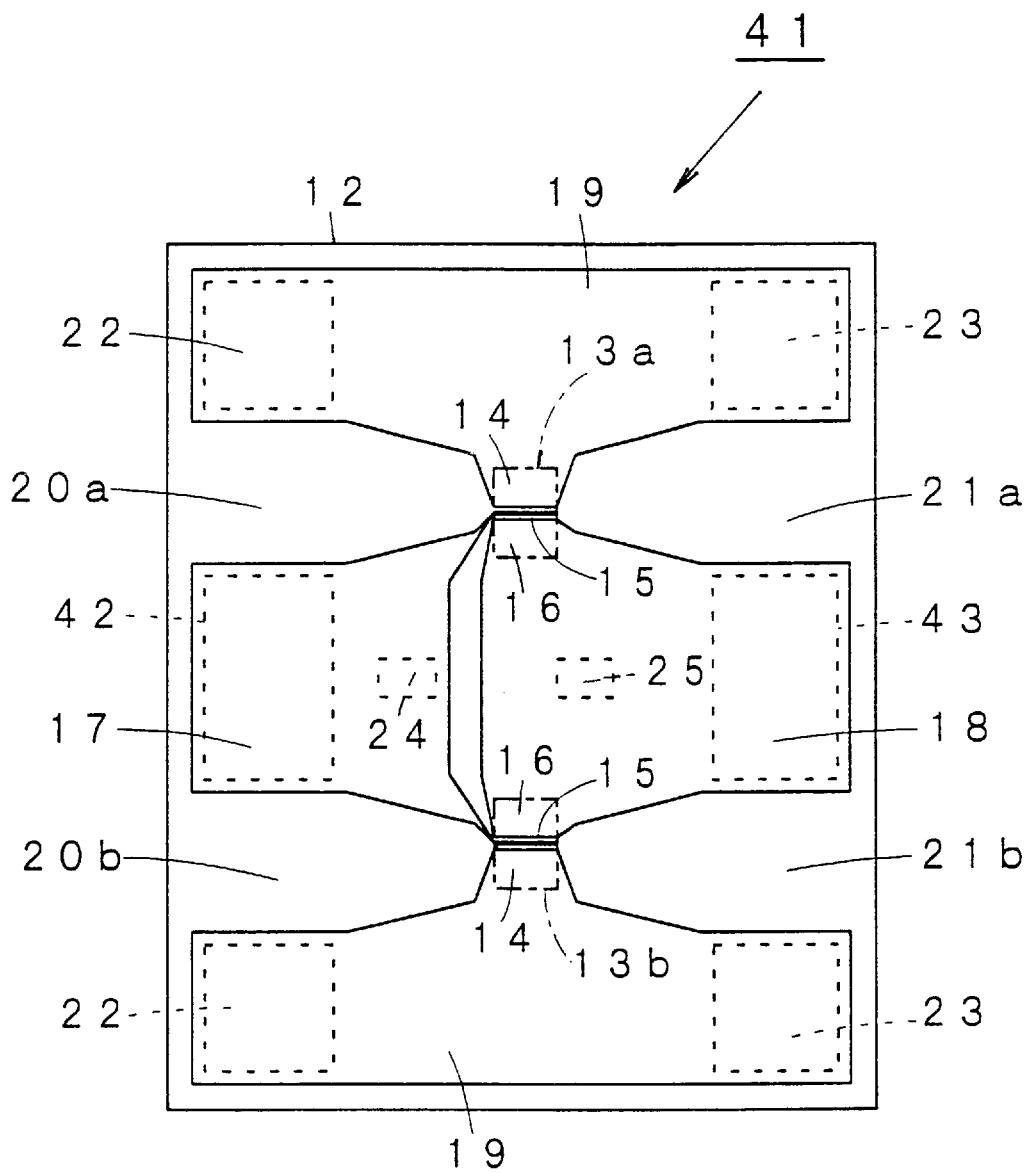
FIG. 5 is a plan view showing a high-frequency semiconductor device according to a second embodiment of the present invention.

FIG. 5 is a plan view showing a structure of a high-frequency semiconductor device 41 according to another embodiment of the present invention. This semiconductor device 41 is usable for amplification, oscillation, or mixing. In this semiconductor device 41, slot lines are not divided. Instead, separate slot lines 20a and 20b are formed between a gate pad section 17 and source pad sections 19, and separate slot lines 21a and 21b are also formed between a drain pad section 18 and the source pad sections 19. The gate pad section 17 and the drain pad section 18 extend to ends of a semiconductor substrate 12 to align with the ends of the source pad sections 19, and via holes 42 and 43 are provided at ends of the gate pad section 17 and the drain pad section 18.

Figure 6:
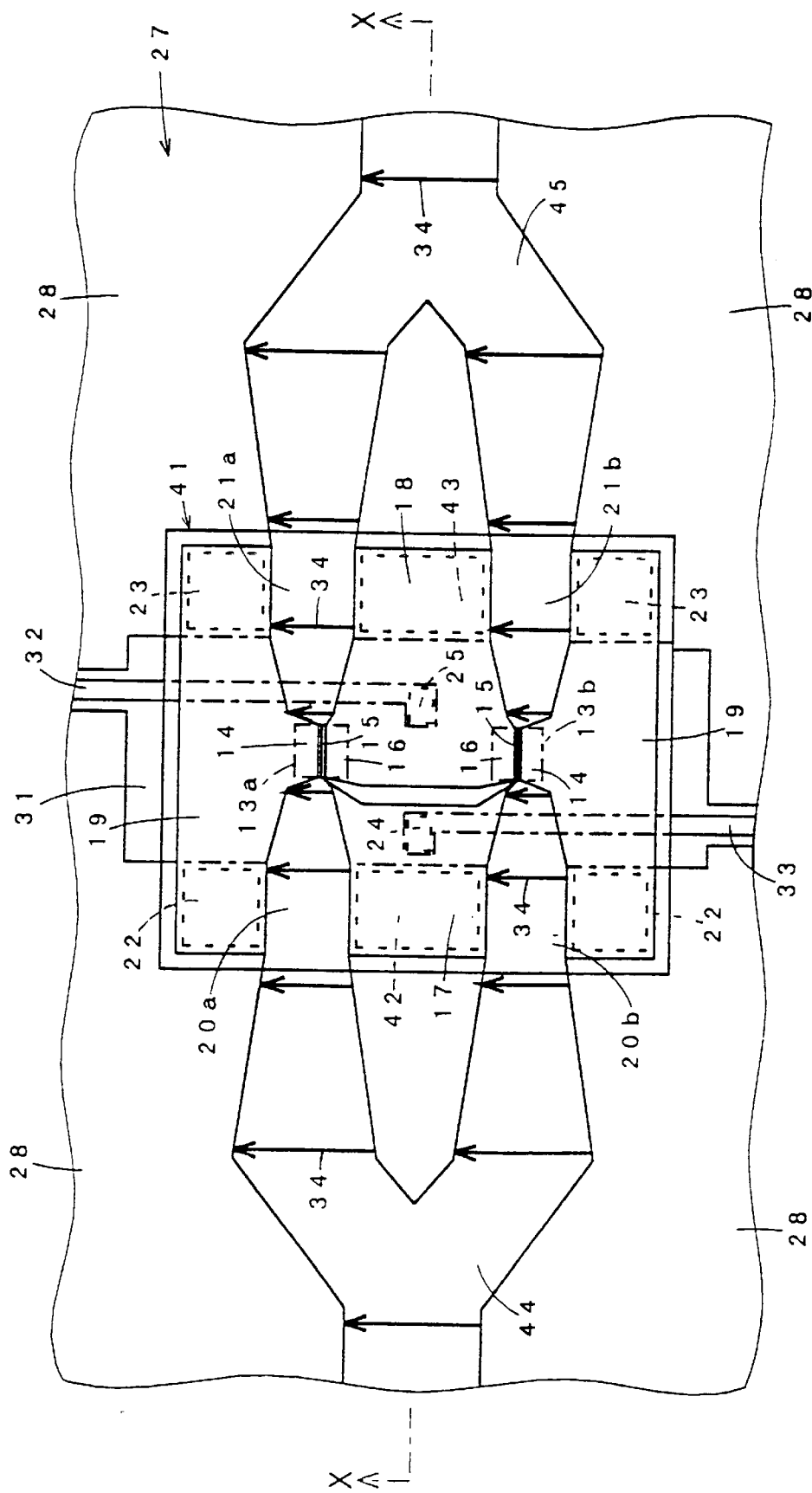
FIG. 6 is a partially-broken-away plan view showing a condition in which the above semiconductor device is mounted on a circuit board.
Figure 7:
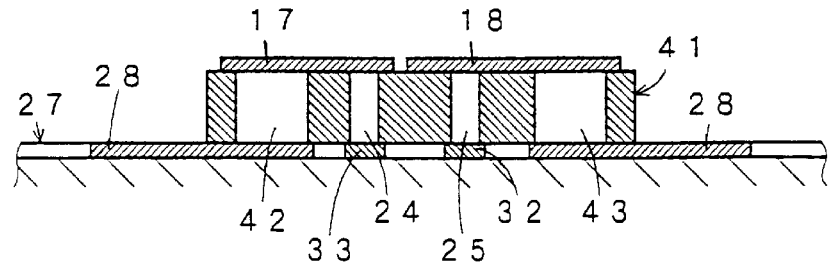
FIG. 7 is a cross-section taken on line X—X shown in FIG. 6.

FIG. 6 is a plan view illustrating a condition in which the above-described high-frequency semiconductor device 41 is mounted on a circuit board 27, and FIG. 7 is a cross-section taken on line X—X shown in FIG. 6. Input and output slot lines 44 and 45 provided for the circuit board 27 branch in a Y shape. The semiconductor device 41 is mounted on the circuit board 27 such that the via holes 22 and 23 electrically connected to the source pad sections 19 are connected to the ground conductor 28 of the circuit board 27, the via hole 42 electrically connected to the gate pad section 17 is connected to the ground conductor 28 between the two portions into which the slot line 44 branches, of the circuit board 27, and the via hole 43 electrically connected to the drain pad section 18 is connected to the ground conductor 28 between the two portions into which the slot line 45 branches. The via hole 24 electrically connected to the gate pad section 17 is connected to a gate bias line 33, and the via hole 25 electrically connected to the drain pad section 18 is connected to a drain bias line 32. Therefore, the branch-type slot lines 44 and 45 provided for the circuit board 27 are connected respectively to the slot lines 20a and 20b, and 21a and 21b, of the semiconductor device 41.

An RF signal (electromagnetic wave) transferring through the slot line 44 is divided into two portions on the circuit board 27, and is input to the slot lines 20a and 20b of the semiconductor device 41. RF signals output from the slot lines 21a and 21b of the semiconductor device 41 transfer through the slot line 45 of the circuit board 27 and are combined in the slot line 45 of the circuit board 27.

(Third embodiment)

Figure 8:
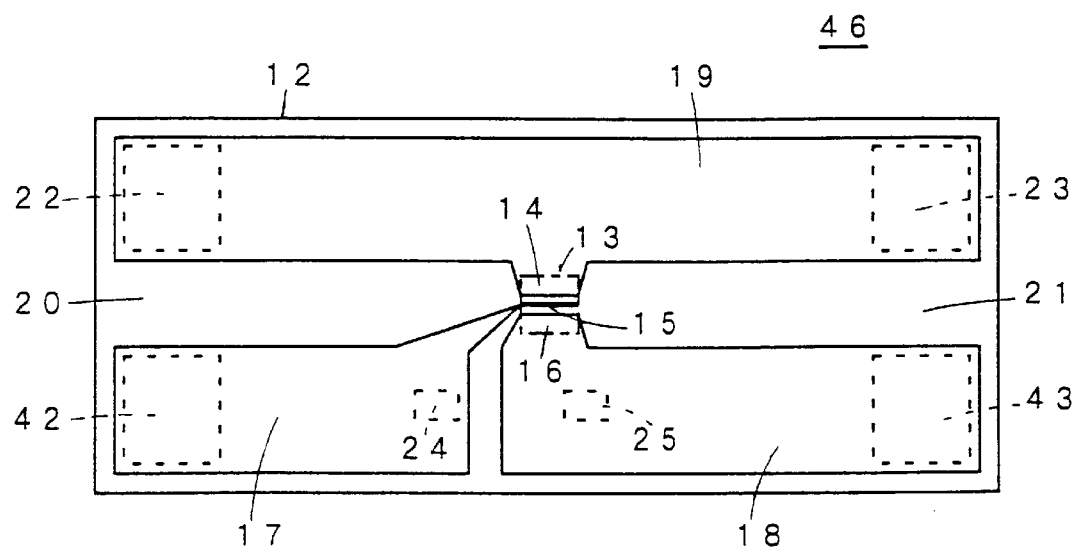
FIG. 8 is a plan view showing a high-frequency semiconductor device according to a third embodiment of the present invention.

By essentially cutting the structure shown in FIG. 5 in half, a high-frequency semiconductor device can be made having only one active area as well as slot lines at its input and output sides. FIG. 8 shows a high-frequency semiconductor device 46 having one active area 13 as described above.

(Fourth embodiment)

Figure 9:
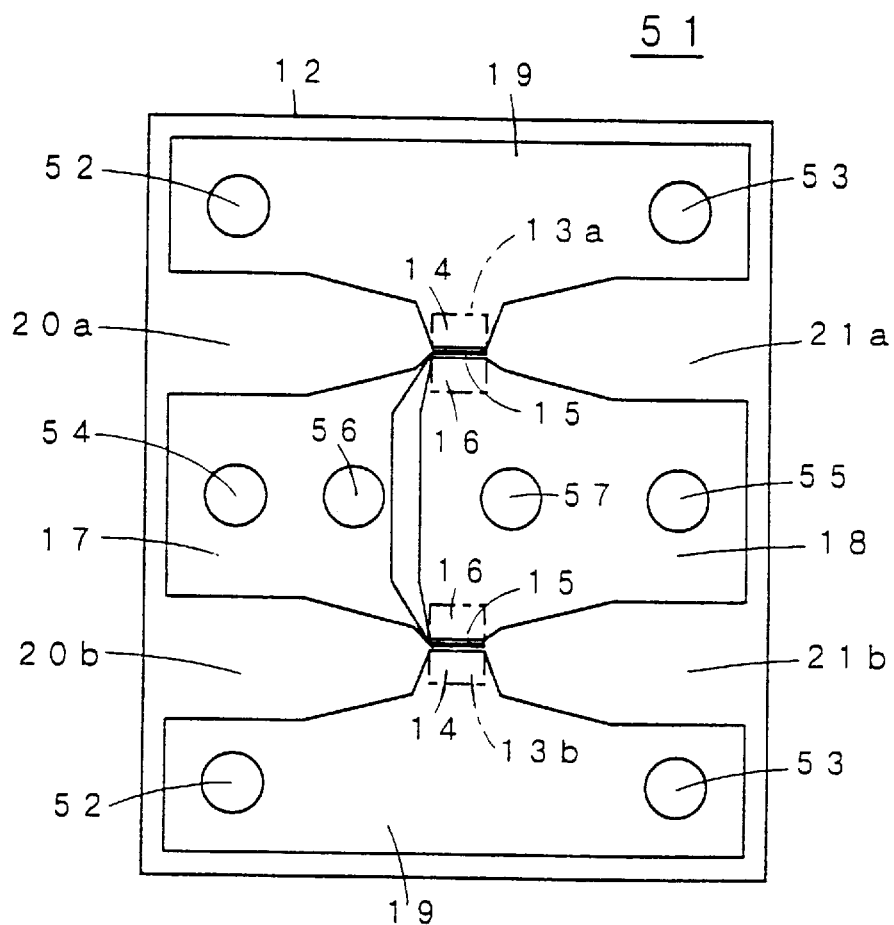
FIG. 9 is a plan view showing a high-frequency semiconductor device according to a fourth embodiment of the present invention.
Figure 10:
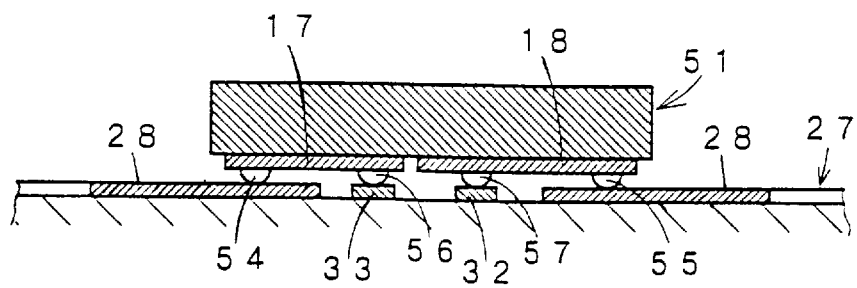
FIG. 10 is a cross-section illustrating a condition in which the above semiconductor device is mounted on a circuit board.

FIG. 9 is a plan view showing a high-frequency semiconductor device 51 according to still another embodiment of the present invention. FIG. 10 is a cross-section illustrating a condition in which the semiconductor device 51 is mounted on a circuit board 27. In this semiconductor device 51, source pad sections 19, a drain pad section 18, and a gate pad section 17 are provided with solder bumps 52, 53, 54, 55, 56, and 57 instead of via holes.

The semiconductor device 51 is flip-chip mounted on the same circuit board as the circuit board 27 shown in FIG. 6, such that the bumps 52 and 53 electrically connected to the source pad sections 19 are connected to the ground conductor 28 of the circuit board 27, a bump 54 electrically connected to the gate pad section 17 is connected to the ground conductor 28 between the two portions of the slot line 44, of the circuit board 27, and a bump 55 electrically connected to the drain pad section 18 is connected to the ground conductor 28 between the two portions of the slot line 45. A bump 56 electrically connected to the gate pad section 17 is connected to the gate bias line 33, and a bump 57 electrically connected to the drain pad section 18 is connected to the drain bias line 32. The branch-type slot lines 44 and 45 provided for the circuit board 27 are connected respectively to the slot lines 20a and 20b, and 21a and 21b, of the semiconductor device 41 through the bumps 52 to 57.

(Fifth embodiment)

Figure 11:
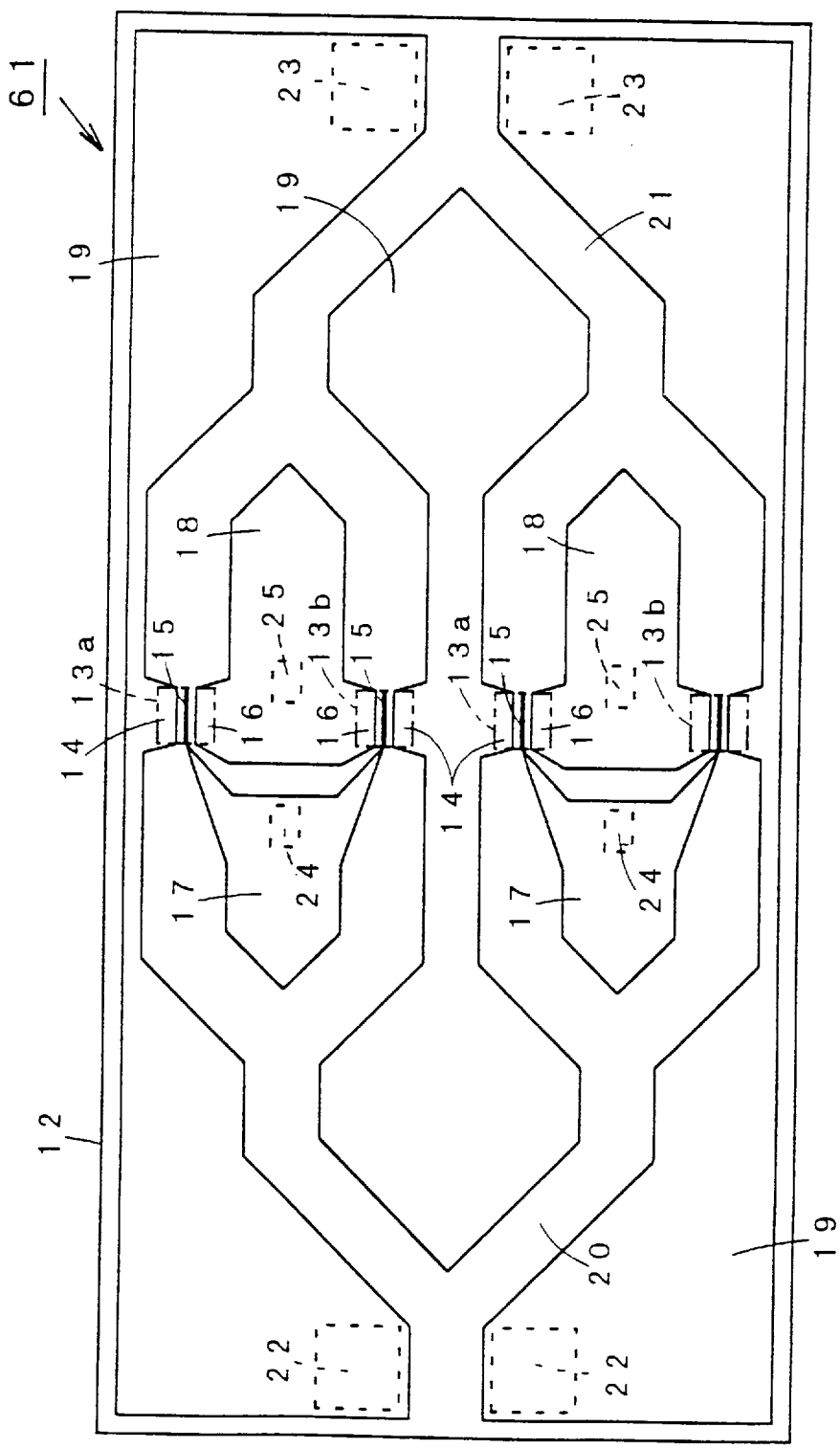
FIG. 11 is a plan view showing a high-frequency semiconductor device according to a fifth embodiment of the present invention.

FIG. 11 is a plan view showing a high-frequency semiconductor device 61 according to a further embodiment of the present invention. In this semiconductor device 61, slot lines 20 and 21 are divided twice, and thereby an RF signal input to the slot line 20 is transferred to four active areas 13*a* and 13*b* and RF signals output from the four active areas 13*a* and 13*b*, are combined in the slot line 21 and output. In this semiconductor device 61, its output can be increased and even-order harmonics can be eliminated.

(Sixth and Seventh embodiments)

Figure 12:
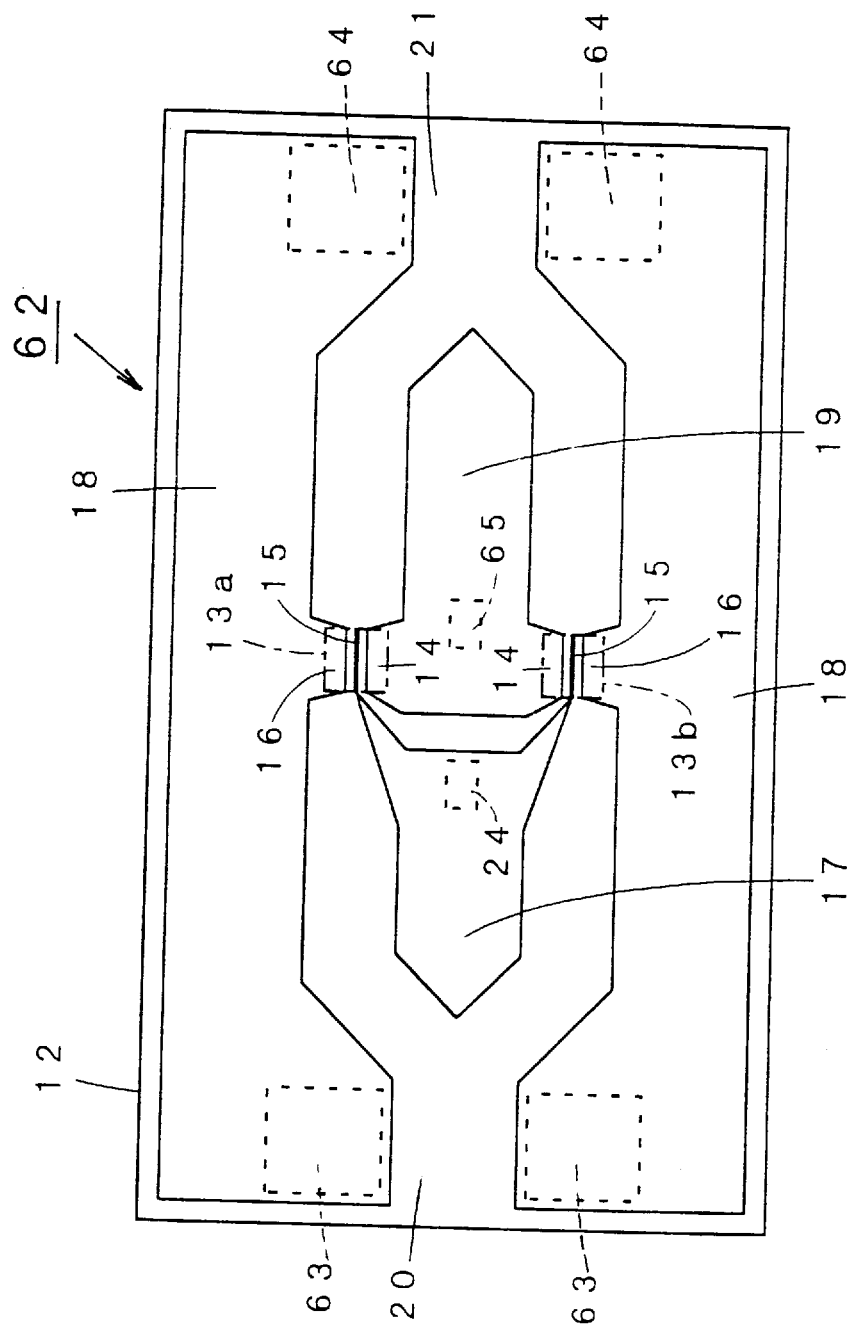
FIG. 12 is a plan view showing a high-frequency semiconductor device according to a sixth embodiment of the present invention.

In each of the high-frequency semiconductor devices described in the above embodiments, the source electrodes 14 and the source pad sections 19 may change places with the drain electrodes 16 and the drain pad section 18. FIG. 12 shows a high-frequency semiconductor device 62 in which the source electrodes 14 and the source pad section 19 have been interchanged with the drain electrodes 16 and the drain pad section 18, as compared with the device shown in FIG. 2. In this case, an input slot line 20 is formed between the drain pad section 18 and the gate pad section 17, and an output slot line 21 is formed between the drain pad section 18 and the source pad sections 19. In FIG. 12, via holes 63 and 64 are electrically connected to the input and output sides of the drain pad sections 18, and connected to the ground conductor of a circuit board. A via hole 65 is electrically connected to the source pad section 19 and connected to a source bias line of the circuit board.

Figure 13:
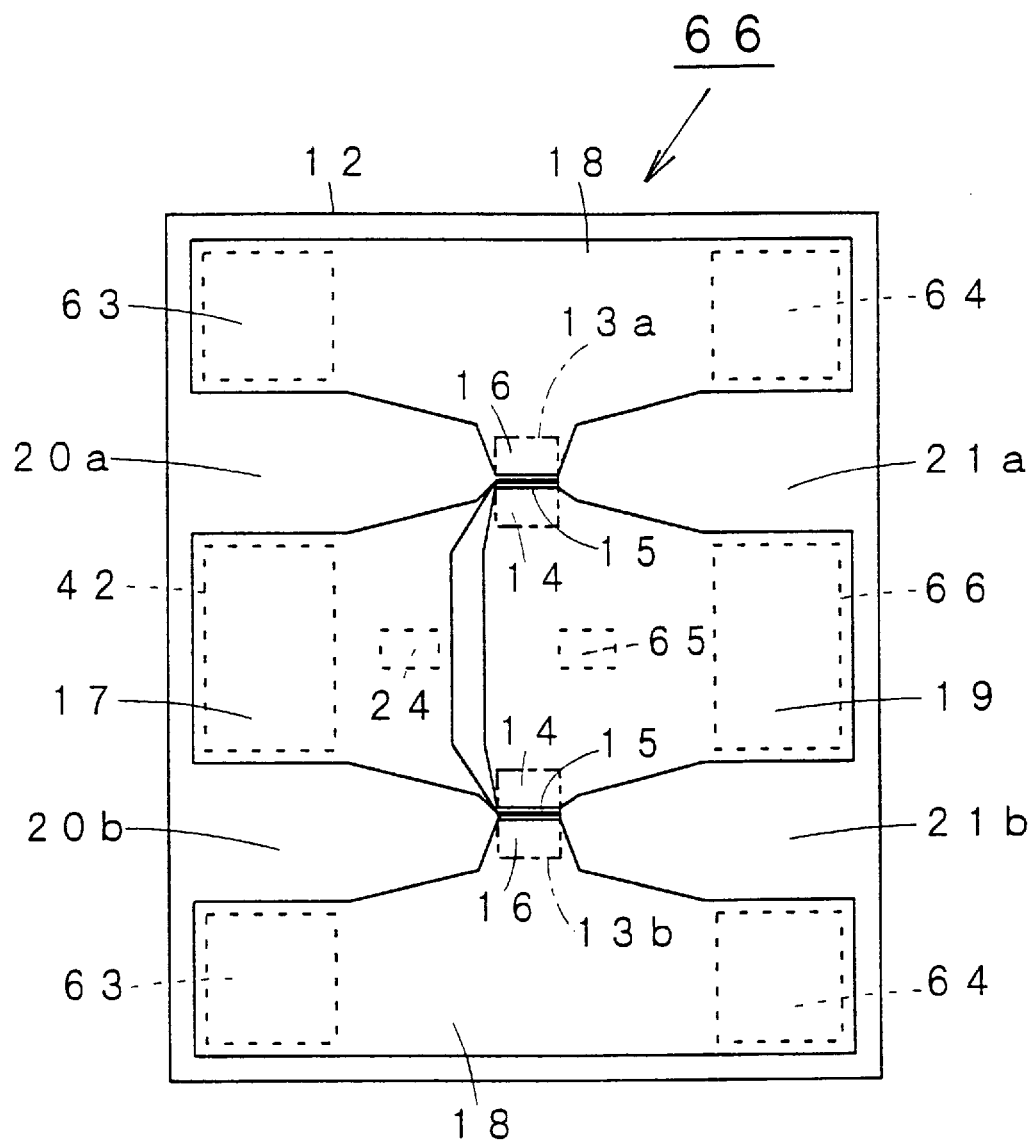
FIG. 13 is a plan view showing a high-frequency semiconductor device according to a seventh embodiment of the present invention.

FIG. 13 shows a high-frequency semiconductor device 66 in which the source electrodes 14 and the source pad sections 19 have been interchanged with the drain electrodes 16 and the drain pad section 18, as compared with the device shown in FIG. 5.

Also in these semiconductor devices 62 and 66 in which the source pad sections 19 have been interchanged with the drain pad section 18, parasitic inductance and parasitic capacitance can be suppressed in the same way as in the embodiments shown in FIGS. 2 and 5.

What is claimed is:

1. A high-frequency semiconductor device, comprising:

a source electrode and a drain electrode disposed with a gate electrode therebetween on an active area in a semiconductor substrate;

a gate pad section electrically connected to said gate electrode at one side of said active area on said semiconductor substrate and a drain pad section electrically connected to said drain electrode at the other side;

a source pad section electrically connected to said source electrode disposed at a position opposed to said gate pad section and said drain pad section; and slot lines disposed between said gate pad section and said source paid section and between said drain pad section and said source pad section, said slot lines being structured and arranged to carry an RF signal to/from said active area in said semiconductor substrate.

2. A high-frequency semiconductor device in which a source electrode and a drain electrode are disposed with a gate electrode placed therebetween on each of a plurality of active areas formed in a semiconductor substrate;

wherein said source electrodes, said gate electrodes, and said drain electrodes are disposed symmetrically to each other in adjacent active areas;

a gate pad section electrically connected to both gate electrodes in said adjacent active areas is disposed in an area at one side on said semiconductor substrate, and a drain pad section electrically connected to both drain electrodes in said adjacent active areas is disposed in an area at the other side on said semiconductor substrate;

source pad sections electrically connected to said source electrodes in said adjacent active areas are disposed at both sides of said gate pad section and said drain pad section; and slot lines are formed between said gate pad section and said source pad sections and between said drain pad section and said source pad sections, said slot lines being structured and arranged to carry an RF signal to/from said active area in said semiconductor substrate.

3. A high-frequency semiconductor device according to claim 2, further comprising conductors disposed on said substrate for applying a gate bias to a center line of said gate pad section and a drain bias to a center line of said drain pad section.

4. A high-frequency semiconductor device according to any one of claims 1, 2, and 3, wherein the widths of said slot lines range from 0.04 to 0.12 mm, and said gate electrode has a gate length of 0.12 to 0.18 $\mu$m and a gate width of 80 to 120 $\mu$m.

5. A high-frequency semiconductor device, comprising a source electrode and a drain electrode disposed with a gate electrode therebetween on an active area in a semiconductor substrate;

a gate pad section electrically connected to said gate electrode at one side of said active area on said semiconductor substrate and a source pad section electrically connected to said source electrode at the other side;

a drain pad section electrically connected to said drain electrode disposed at a position opposed to said gate pad section and said source pad section; and slot lines disposed between said gate pad section and said drain pad section and between said drain pad section and said source pad section, said slot lines being structured and arranged to carry an RF signal to/from said active area in said semiconductor substrate.

6. A high-frequency semiconductor device in which a source electrode and a drain electrode are disposed with a gate electrode placed therebetween on each of a plurality of active areas formed in a semiconductor substrate;

wherein said source electrodes, said gate electrodes, and said drain electrodes are disposed symmetrically to each other in adjacent active areas;

a gate pad section electrically connected to both gate electrodes in said adjacent active areas is disposed in an area at one side on said semiconductor substrate, and a source pad section electrically connected to both source electrodes in said adjacent active areas is disposed in an area at the other side on said semiconductor substrate;

drain pad sections electrically connected to said drain electrodes in said adjacent active areas are disposed at both sides of said gate pad section and said source pad section; and slot lines are formed between said gate pad section and said drain pad sections and between said drain pad sections and said source pad section, said slot lines being structured and arranged to carry an RF signal to/from said active area in said semiconductor substrate.

7. A high-frequency semiconductor device according to claim 6, further comprising conductors disposed on said substrate for applying a gate bias to a center line of said gate pad section and a source bias to a center line of said source pad section.

8. A high frequency semiconductor device according to any one of claims 1, 2 5 and 6, wherein the width of said slot lines is determined based on matching of input and output impedances.

\* \* \* \* \*